(12) United States Patent
Yen et al.

(10) Patent No.: US 6,567,934 B1
(45) Date of Patent: May 20, 2003

(54) METHOD AND APPARATUS FOR VERIFYING MULTIPROCESSING DESIGN IN A UNIT SIMULATION ENVIRONMENT

(75) Inventors: Jen-Tien Yen, Austin, TX (US); Qichao Richard Yin, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/422,312

(22) Filed: Oct. 21, 1999

(51) Int. Cl.$^7$ ................................................. G06F 11/00
(52) U.S. Cl. ................................................. 714/33; 703/21
(58) Field of Search ............................ 714/33, 41, 47, 714/741, 43; 703/15, 21; 716/4

(56) References Cited

U.S. PATENT DOCUMENTS

| | | | | |
|---|---|---|---|---|
| 5,613,087 A | * | 3/1997 | Chin et al. | 711/154 |
| 5,671,231 A | * | 9/1997 | Cooper | 714/724 |
| 5,740,353 A | * | 4/1998 | Kreulen et al. | 714/33 |
| 5,859,962 A | * | 1/1999 | Tipon et al. | 703/21 |
| 5,960,457 A | * | 9/1999 | Skrovan et al. | 711/141 |
| 5,999,721 A | * | 12/1999 | Colglazier | 703/14 |
| 6,012,157 A | * | 1/2000 | Lu | 714/719 |
| 6,131,079 A | * | 10/2000 | Smith | 703/13 |
| 6,178,533 B1 | * | 1/2001 | Chang | 200/16 D |
| 6,226,716 B1 | * | 5/2001 | Bauman et al. | 703/13 |
| 6,226,760 B1 | * | 5/2001 | Burkhardt et al. | 404/102 |
| 6,230,114 B1 | * | 5/2001 | Hellestrand et al. | 703/13 |
| 6,263,302 B1 | * | 7/2001 | Hellestrand et al. | 703/17 |
| 6,446,241 B1 | * | 9/2002 | Mobley et al. | 711/141 |
| 6,453,437 B1 | * | 9/2002 | Kapur et al. | 714/741 |

* cited by examiner

*Primary Examiner*—Robert Beausoliel
*Assistant Examiner*—Bryce P. Bonzo
(74) *Attorney, Agent, or Firm*—James L. Clingan, Jr.

(57) ABSTRACT

A method and apparatus for verification of designed logic in a processing unit (100) that performs multiprocessing functions is presented. Once the multiprocessing unit to be exercised as the device under test (350) is defined, an irritator (330) is constructed to provide the stimuli to the interface of the device under test (350) such that the device under test (350) is exercised. The irritator (330) receives instructions (314) as its input, where relevant instructions are converted to transactional stimulus that is applied to the device under test (350). The irritator (330) also monitors the interface of the device under test (350) to detect when multiprocessing operations executed by other processing units (340) included in the system (5) require a response. The response is produced via signal stimulus on the interface of the device under test (350) to which the irritator (330) is coupled.

11 Claims, 7 Drawing Sheets

METHOD AND APPARATUS FOR VERIFYING MULTIPROCESSING DESIGN IN A UNIT SIMULATION ENVIRONMENT

FIELD OF THE INVENTION

The present invention relates generally to testing, and more particularly to a method and apparatus for verifying multiprocessing design in a unit simulation environment.

RELATED ART

In order to achieve large amounts of processing bandwidth, multiple processors are often combined in a single system such that parallel-processing operations can occur. In such systems, the multiple processing entities often share a single memory structure that is accessed via a common bus. Another feature that increases the processing capabilities of such multiprocessing systems is the inclusion of one or more cache structures in one or more of the processing entities. High performance processing systems often include more than one cache structure in each processing entity.

Because of the shared memory structure and the inclusion of the cache structures within the processing entities, data integrity, which is crucial to proper system operation, becomes an issue that must be addressed. In one example, data integrity may be compromised in such systems if the data corresponding to a particular memory address is cached in a modified form in one of the processing entities, and another processing entity which desires to utilize the same data retrieves it from memory without notification that an updated version of the data is present in the cache structure of the other processing entity. Although various parameters are included in the caching structures to indicate the various potential states of cached data, the interaction between the multiple processors requires constant monitoring and maintenance of these parameters in order to ensure data integrity.

In prior art systems that include multiple processors, verification of the logic that controls the interactions that assist in maintaining data integrity was not adequately verified until late in the design process. The reason for the late occurrence of verification of the multiprocessing portion of the system design was often due to the need for verification of the other functional blocks within each of the processors prior to verification of the multiprocessing logic. For example, the sequencer that operates on the instructions and the execution units that perform operations on instructions had to be verified in order to allow instruction-based test programs to be executed. Verification of the multiprocessing logic at the system, or chip level, is difficult as the chip model is complex, and therefore execution of test sequences at this level is slow and often does not provide optimal exercising of the multiprocessing portions of the system intended to be verified.

In some prior art systems, transaction-based verification of the multiprocessing blocks is performed at the unit level where the multiprocessing logic is isolated and specifically targeted by the testing. Transaction-based verification applies specific transactions, or signal stimulus sets, at an interface between the multiprocessing block and the other blocks in the processing system. The interface can then be monitored to determine if the proper transactional response occurs.

One drawback of transaction-based testing is that the transaction-based tests are often deterministic tests that were compiled for particular scenarios and required an understanding of the expected results. Random test generation is typically only possible if a behavioral model of the multiprocessing portion of the processor is available to generate expected results. Because the behavioral model must accurately model the operation of the multiprocessing logic as designed, any change to the logic within the multiprocessing portion of the processor requires similar modification to the behavioral model. Maintenance of the behavioral model requires diligence and presents the potential of modeling errors, both of which make random transaction-based tests undesirable.

Another drawback of transactional testing is that as the integration of the multiprocessing portion with other blocks in the processing module occurs during the design process, the transactional tests used to exercise the multiprocessing portion cannot be reused at higher levels of integration. This is because the transactional tests are designed to provide stimulus to a particular interface to the multiprocessing block. This stimulus does not exercise any other portions of the system, and therefore do not provide any benefit at subsequent integration levels. As such, new test sequences must be created in order to properly exercise the design at higher levels of integration.

Therefore, a need exists for a method and apparatus that allows for verification of multiprocessing functionality in a manner that permits instruction-based test sequences to be utilized to exercise the multiprocessing portions of the system at a unit level in a manner that is efficient and exercises this portion of the system at a high rate of speed.

DETAILED DESCRIPTION

Figure 1:
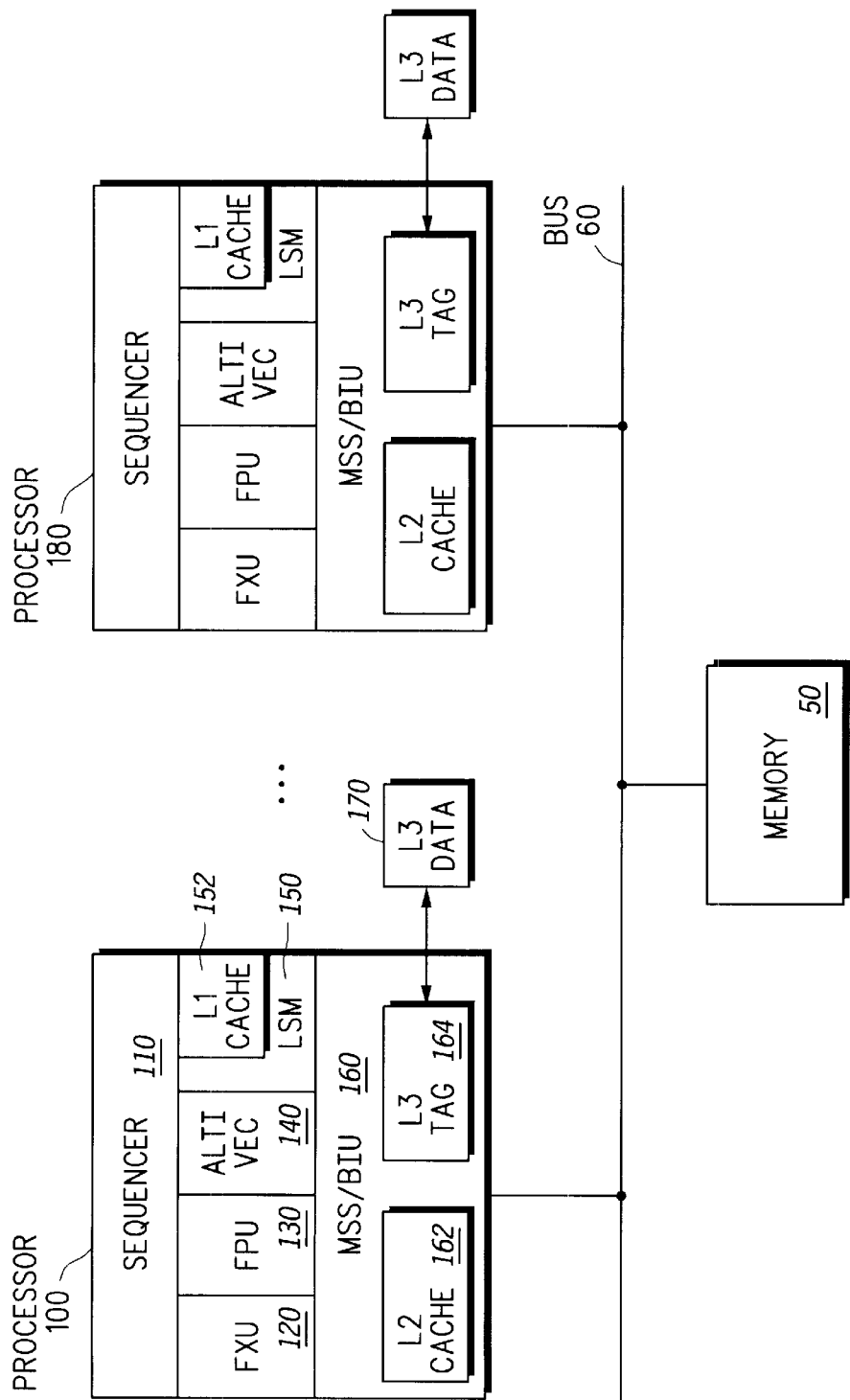
FIG. 1 illustrates a block diagram of a multiprocessing system in accordance with a particular embodiment of the present invention.

Generally, the present invention provides a method and apparatus for verification of designed logic in a processing unit that performs multiprocessing functions. Once the multiprocessing unit to be exercised as the device under test is defined, an irritator is constructed to provide the stimuli to the interface of the device under test such that the device under test is exercised. The irritator receives instructions as its input, where relevant instructions are converted to transactional stimulus that is applied to the device under test. The irritator also monitors the interface of the device under test to detect when multiprocessing operations executed by other processing units included in the system require a response. The response is produced via signal stimulus on the interface of the device under test to which the irritator is coupled.

By allowing the multiprocessing portion of a processing module to be isolated and tested during the design phase, the amount of logic that is exercised during testing is greatly reduced from that if simulation were performed on the integrated system. As such, the simulation time with respect to verification of the multiprocessing portion of the processor is greatly reduced. The efficiency of testing the multiprocessing portion is further enhanced in that the instructions provided to the irritator are effectively filtered by the irritator such that only those instructions which are relevant to multiprocessing operations are converted to transactional signals passed to the device under test.

Another advantage provided by the system and method described herein is that the instructions used to exercise the multiprocessing portions of the processing unit can also be used to exercise the processing unit as an integrated entity. As such, new sets of test sequences do not have to be created once integration occurs, and isolation of any faults at the system level is greatly simplified as the multiprocessing portion has already been tested and debugged.

Generation of the test sequences used to exercise the multiprocessing portion of the processor can be accomplished using a random verification technique that can generate instructions in a random manner. The random manner in which instructions are generated may be weighted or directed to target certain aspects of the processing module. The expected results from such random instructions can be determined based on the reference model for the entire processor or system, which is typically well defined early in the design process and therefore able to return expected results for the random instructions.

Deterministic verification is known to require much more human interaction than random verification and is often employed in transaction-based test generation. Prior art verification systems for multiprocessing logic utilize such transaction-based test generation. Such prior art systems are unable to reuse test sequences generated for exercising the multiprocessing portions of the system at the system level of integration. Prior art systems rarely utilize random test generation as the problems associated with maintaining an accurate behavioral model of the device under test make determination of the expected results of the random tests impractical in all but the most optimal circumstances.

The invention can be better understood with reference to FIGS. 1–7. FIG. 1 illustrates a block diagram of a multiprocessing system that includes processors 100 and 180 operably coupled to a bus 60. Note that the multiprocessing system may include more than two processors. The bus 60 is coupled to a memory 50 that is shared by the processors 100 and 180. Each of the processors 100 and 180 is capable of executing processing instructions independent of the other processor. Both processors 100 and 180 require access to the memory 50 in order to fetch instructions and load and store data.

As is illustrated with respect to processor 100, each of the processors 100 and 180 includes a number of blocks, or units, that enable the processor to execute instructions in efficient manner. With respect to the processor 100, the blocks are shown to include a sequencer 110 that fetches instructions and dispatches the instructions and operands to the appropriate execution units in the proper order. The execution units are shown to include the fixed-point execution unit (FXU) 120 that performs integer operations, the floating point unit (FPU) 130 that performs floating point operations, the altivec block 140 that executes multimedia instructions, and the load store module (LSM) 150 that performs load and store operations with respect to the memory 50. The load store module 150 may also be referred to as a load store unit or LSM block. In order to enable the LSM block 150 to interact with the bus 60 and the memory 50, the memory subsystem/bus interface unit (MSS/BIU) block 160 is included in the processor 100. The configuration of the specific units within a processor and the number of specific units of each unit type may vary for different processor designs. For example, multiple FPU or FXU blocks may be included in the processor or the altivec block may be replaced by another block providing similar functionality.

In order to improve efficiency of execution of instructions by the processor 100 that require memory operations, one or more cache structures may be included in the processor 100. The processor 100 shown in FIG. 1 includes three such caches. The level one (L1) cache 152 is included in the LSM block 150. The level one cache is of relatively limited size, and provides caching of the data corresponding to the most recently accessed memory locations. The level one cache provides efficient and rapid access of the data at these memory locations to the other portions of the processor 100. The MSS/BIU block 160 is shown to include a level two (L2) cache 162. The level two cache included in the MSS/BIU block 160 does not provide the speed of access of the level one cache 152, but is typically much larger in size.

The MSS/BIU block 160 is also shown to include a level three (L3) tag portion 164 of a level three cache. Because the level three cache is very large, only the tag portion 164 is included on the integrated circuit that includes the components of the processor 100. The level three tag portion 164 includes the majority of the control circuitry associated with the level three cache. The data portion of the level three cache 170 is shown to exist as an external memory structure that is coupled to the processor 100 via a backside bus. As is apparent to one of ordinary skill in the art, the data portion of the level three cache 170 may be included on the same integrated circuit as the processor 100. Similarly, further integration may be possible such that the processors 100 and 180 may be included on a single integrated circuit that may also include the memory 50.

Because each of the processors 100 and 180 includes cache structures, problems with data integrity may arise if a method for ensuring such data integrity is not employed by the relevant portions of each of the processors 100 and 180. One such integrity verification technique maintains a cache state for each cached location or group of locations.

In one example system, there are four cache states. The first state is the exclusive-modified (M) state that indicates that the cache location to which that state corresponds is exclusively controlled by that cache, and that the data corresponding to that location has been modified since it was loaded via the bus 60. The second cache state is the exclusive-not-modified state (E) that indicates that although the cache is the exclusive controller of that particular address, the data corresponding to that address has not been modified. The third cache state is the shared (S) cache state, which indicates that more than one processor is currently storing data corresponding to that address in its cache structure. The final cache state is the invalid (I) cache state that indicates that the data stored at that cache location is invalid, and most likely does not match the true current value corresponding to the address of that cache location. The transitions between these various states are quite complex, and the support of such transitions requires complex multiprocessing circuitry that, if not properly tested and debugged, can induce faults into the overall multiprocessing system.

A simple example can illustrate the potential problems associated with a caching in a multiprocessing environment. Assume that the processor 100 loads the data corresponding to address A from the memory 50. The cache within the processor 100 will indicate that the state of that location is exclusively under the control of the processor 100. Before the processor 100 performs any operations that modify the data corresponding to address A, the processor 180 issues a request to the bus 60 indicating that it also would like to load the data corresponding to address A for an operation. At this point, the bus 60 will indicate to the processor 100 that an operation is occurring that requires the processor 100 to snoop, or examine, the transaction occurring on the bus 60. The snooping of the processor 100 will determine if the operation occurring on the bus 60 requires the processor 100 to either modify the state of a particular address location in one of its caches, or return an indication that it is storing a version of the data for that address (and possibly a value for the data corresponding to the address if it differs from that stored in the memory 50). These two operations will be described in additional detail with respect to FIGS. 6 and 7 below.

Once the processor 180 has loaded the data corresponding to address A, the data is no longer under exclusive control of the processor 100. As such, the processor 100, should determine through its snooping that this data is now shared data. The processor 100 can then change the state corresponding to address A within its cache structures to indicate the shared state. Similarly, the processor 180 should receive an indication from the processor 100 that it currently stores a copy of the data corresponding to address A and therefore the processor 180 will note that the state of the data corresponding to address A within its cache structures is also shared.

If, subsequent to loading the data corresponding to address A, the processor 180 modifies the data corresponding to address A, it will change the state within its cache structures of the location corresponding to address A to the exclusive modified state. This is because the only copy of the current value corresponding to address A is contained within the cache structures of the processor 180. The processor 180 must also issue an indication that the processor 100 can recognize such that the processor 100 will alter the state of its copy of the data corresponding to address A to reflect that that copy is now invalid.

As can be seen through this simple example, the interaction between multiple processors in a multiprocessing environment that is required to ensure data integrity is complex. As such, the need to ensure that the logic designed to support such multiprocessing functionality is free of defects is crucial to producing an operational system within the time constraints placed on the product development process. As such, the simulation of the design of this portion of each of the processors should be both rigorous and thorough. Such thoroughness was difficult to achieve in prior art systems that utilize transaction-based simulation techniques to verify the multiprocessing functionality within each of the processors. The transaction-based simulation performed in such prior art systems typically only detects a portion of the faults present in the multiprocessing design. Although additional faults are often detected once complete integration of the processor design occurs, the efficiency with which the particular multiprocessing portions of the processor can be simulated at this level is greatly reduced from that which is available when the multiprocessing portions are isolated. As such, additional time is added to the design cycle, thus reducing the overall speed with which new processors capable of multiprocessing can be delivered to a highly competitive marketplace.

The techniques described herein permit simulation of the multiprocessing portions of the processor prior to integration through the use of instruction-based testing. Irritators included in the system are able to compile transaction-based stimuli for application to the multiprocessing portions of the processor based on an instruction stream such that the multiprocessing portion can be exercised at the unit level prior to integration into the complete processing system. Unit level instruction-based simulation was not possible in prior art systems.

Figure 2:
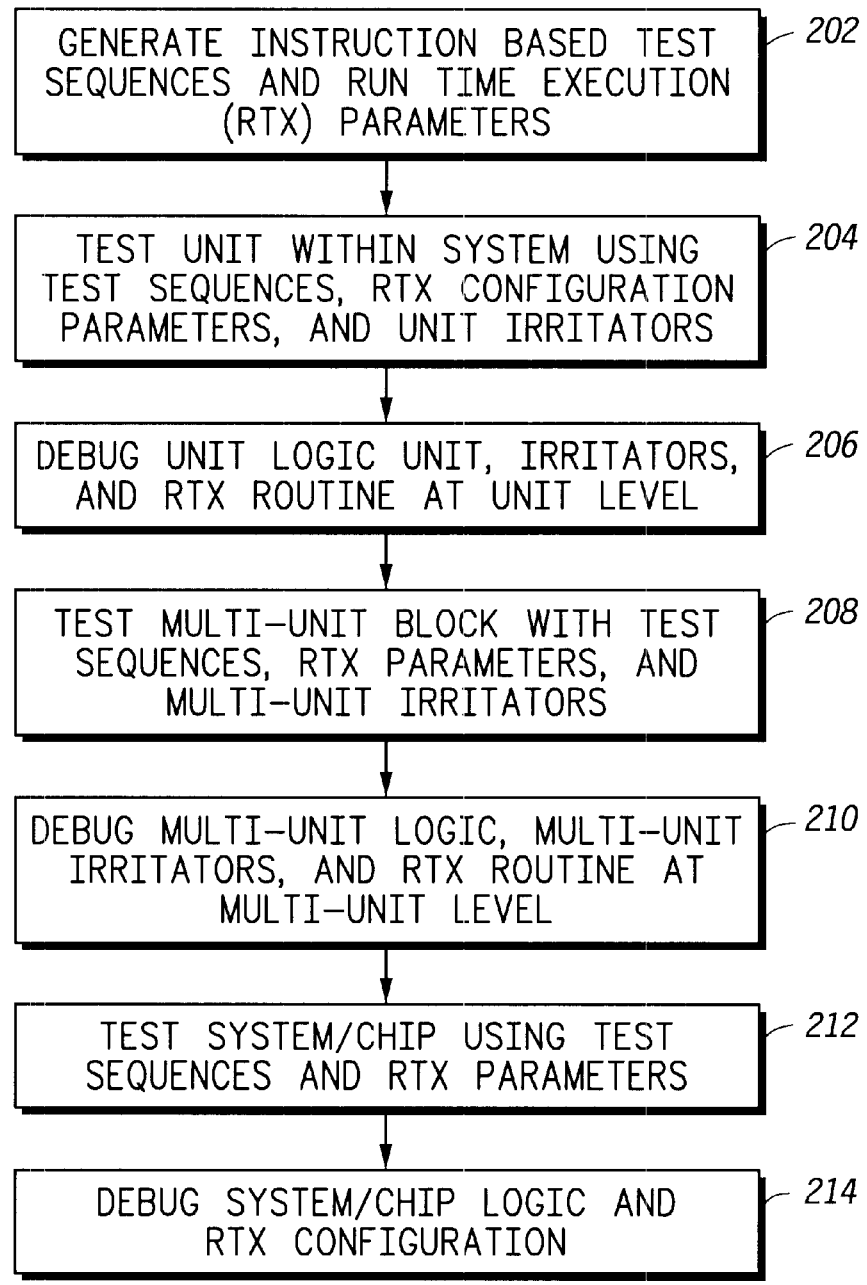
FIG. 2 illustrates a flow diagram of a method for verification of multiprocessing functionality in a multiprocessing system in accordance with a particular embodiment of the present invention.

FIG. 2 illustrates a flow diagram that outlines the design, testing, and debugging of a processor that includes multiprocessing functionality. The method begins at step 202 where instruction-based test sequences (test case programs) are generated along with run time execution (RTX) parameters. The test sequences generated may be a set of instructions that are defined to test the processing unit (processor). The test sequences generated at step 202 are instruction-based test sequences for which expected results can be determined based on the reference model for the overall processing system that is well defined and debugged very early in the design process. Because the expected results of such instruction-based test sequences can be determined based on the reference model, random test sequence generation can be utilized with the understanding that the expected result of such random test sequences will be readily available. Such random test sequence generation is not as feasible in prior art unit-level simulation systems that require accurate maintenance of a behavioral model of the specific unit being tested in order to determine expected results.

The run-time execution parameters generated at step 202 include initial settings for various parameters in the simulation model in order to ensure that the circuitry is tested thoroughly. The parameters which may be configured in order to ensure thorough exercising of the circuitry include various registers, data that may be stored in memory or in cache structures with various cache states, variables that determine specific modes within which the processor can operate, and special purpose registers (SPRs) that may control such interactions such as clocking ratios, external memory types, cache sizes, etc. These run-time execution parameters are required for simulation at both the unit, multi-unit, and system levels. Preferably, the run-time execution parameters generated at step 202 are generated in a manner such that they are applicable to the various levels of testing is ensured, thus eliminating the need to regenerate such parameters for each type of testing that must occur during the design process.

At step 204, the unit with the processing system is tested using the test sequences and RTX configuration parameters generated at step 202. In order to utilize the instruction-based test sequences generated at step 202 to exercise the specific unit being tested, which in a multiprocessing system is preferably the designed memory subsystem, the test sequences and RTX configuration parameters must be processed to determine their applicability to the specific unit being tested. This may be accomplished by defining a subset of the set of instructions relevant to the memory subsystem when the memory subsystem is the unit undergoing testing. The relevant instructions can then be translated into a plurality of transactions that are applied to the memory subsystem as designed, where the logic is responsive to the transactions resulting from the subset of instructions.

Figure 3:
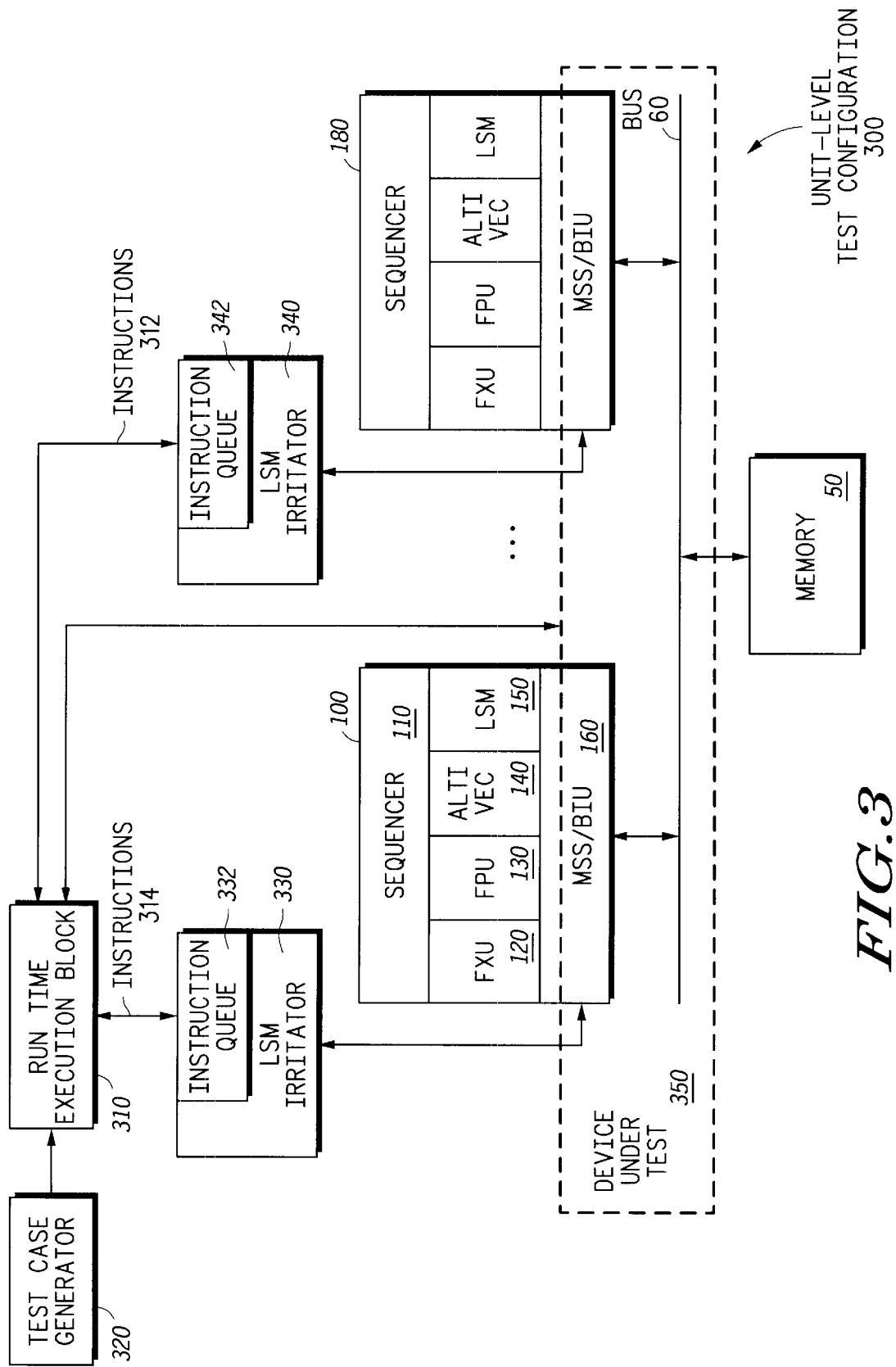
FIG. 3 illustrates a block diagram of a unit-level test configuration of a multiprocessing system as described in the method of FIG. 2.

FIG. 3 illustrates a multiprocessing system configured in a unit-level test configuration 300. The unit level test configuration 300 defines the specific device under test 350 as the unit being tested using the instruction-based test sequences. The device under test 350 of FIG. 3 is shown to include the MSS/BIU blocks of the processors 100 and 180 and the bus structure 60. This set of blocks may be referred to as the designed memory subsystem, which in the configuration shown, is being tested independently of the remaining portions of the processing unit. Thus, the specific circuitry exercised in the configuration of FIG. 3 includes the level two and level three cache structures as illustrated in FIG. 1 and the corresponding circuitry that ensures data integrity with respect to interactions of the MSS/BIU blocks and the bus 60. The sequencer portions of the processors along with the execution modules are not exercised in the unit-level test configuration 300, and the testing is isolated to the specific units included in the device under test 350. In order to convert the instruction-based test sequences to transaction-based stimulus that can be applied to the MSS/BIU block 160, and LSM irritator 330 is included in the unit level test configuration 300. Because multiprocessing functionality is being simulated, the MSS/BIU block of the processor 180 may also be stimulated. In order for this to occur, a similar LSM irritator 340 is included in the system.

Each of the LSM irritators 330 and 340 receive instructions 314 and 312, respectively, from the run-time execution block 310. The instructions may be queued in instruction queues 332 and 342 included in the LSM irritators 330 and 340, respectively. Each of the LSM irritators receives the instructions from the run-time execution block 310 and determines which of the instructions received are relevant to operation of the device under test 350. When a relevant instruction is detected, the LSM irritator parses the instruction to generate the appropriate stimulus to be applied to the MSS/BIU block, which is, at an appropriate time, applied to the MSS/BIU block in order to exercise the logic contained therein. Thus, the instructions included in the instruction-based test sequences are converted to transactional stimulus that is applied to the appropriate signals on the device under test 350 in order to specific exercise the logic included in this particular unit. As stated earlier, such instruction-based unit level simulation was not possible in prior art systems.

The run-time execution block 310 included in the unit level test configuration 300 of FIG. 3 receives the instruction-based test sequences from the test case generator 320 and parses the test sequences to produce the appropriate instructions 312 and 314 provided to each of the LSM irritators 330 and 340. Thus, the run-time execution block 310 oversees the overall multiprocessing operations. As a part of this overall control, the run-time execution block 310 provides the initialization parameters to the device under test 350 and any other portions of the circuitry included in the test configuration such that the various modes and initial states of the portion of the circuitry being tested can be fully exercised. The run-time execution block also controls the clocking of the various portions of the system and may perform the evaluation of any results produced through execution of the instructions in the test sequence.

Returning to FIG. 2, at step 206, the unit logic tested at step 204 is debugged along with the unit irritators (LSM irritators in FIG. 3) and the run-time execution routines corresponding to the unit level. Debugging these portions of the system ensures that the logic included in the device under test 350 is free of faults prior to integration with additional portions of the multiprocessing system.

At step 208, an additional level of integration is achieved in that multi-unit blocks are subjected to testing based on the instruction-based test sequences and run-time execution parameters developed at step 202. Thus, additional units are included in the device under test. However, the same test sequences and RTX parameters are utilized to test these multi-unit blocks.

Figure 4:
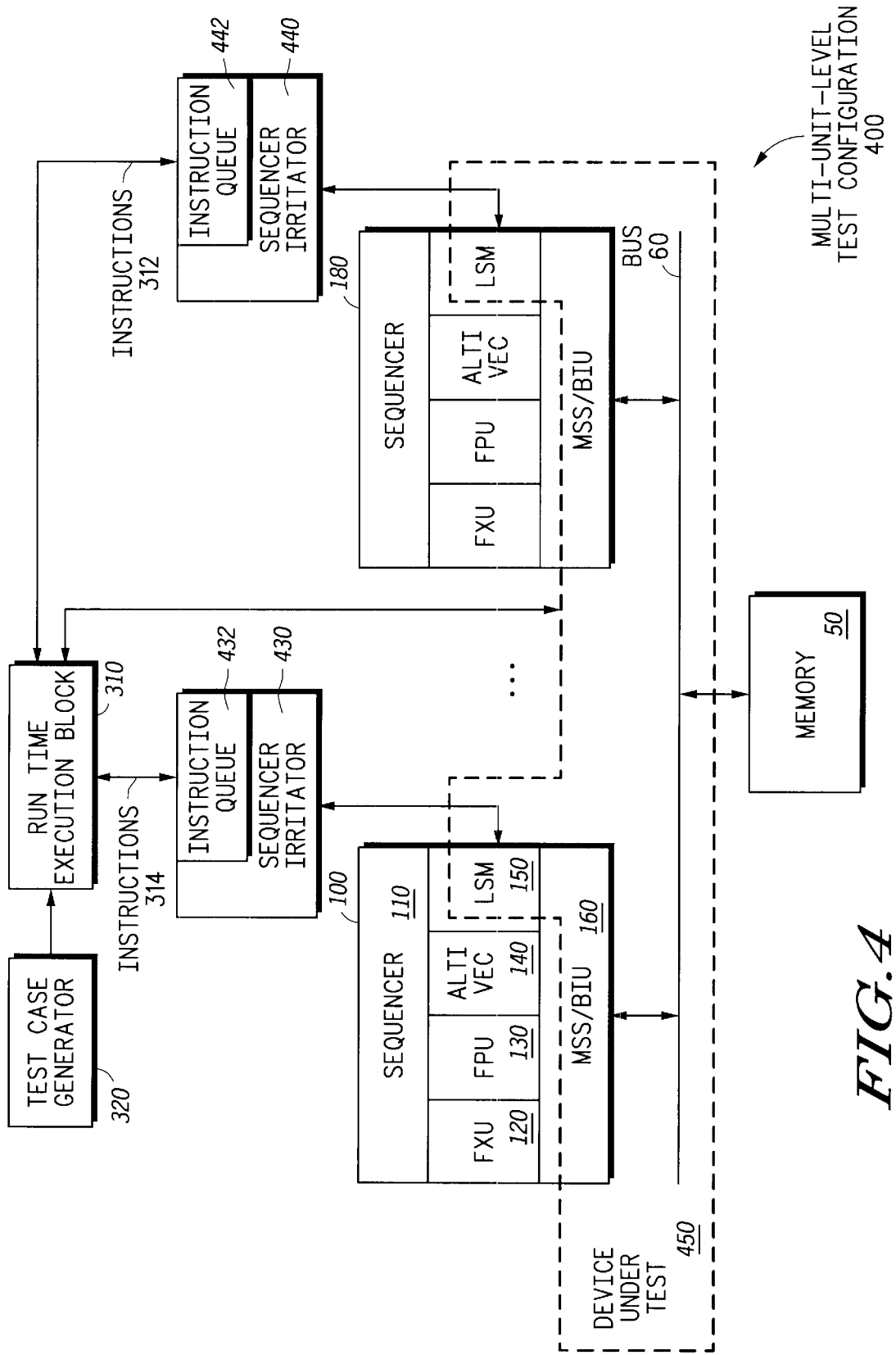
FIG. 4 illustrates a block diagram of a multi-unit-level test configuration of a multiprocessing system as described with respect to the method of FIG. 2.

FIG. 4 illustrates the multi-unit level test configuration 400 that is shown to include the LSM blocks of the processors 100 and 180 in the device under test 450. Run time execution block 310 operate the MSS/BIU block 160 in conjunction with the LSM block 150. Thus, a run time executor can operate a designed memory subsystem in conjunction with additional designed units. Because the LSM blocks are included in the device under test 450 of FIG. 4, the LSM irritators utilized in the unit level test configuration 300 of FIG. 3 are no longer applicable. Instead, the sequence irritators 430 and 440 are shown to be coupled to the LSM blocks within the device under test 450. As such, each of the sequence irritators 430 and 440, which may also include instruction queues 432 and 442, respectively, receive the instructions 314 and 312, respectively, from the run-time execution block 310. The run-time execution block does not alter its general operation from that which was present in the unit level test configuration 300 of FIG. 3. The run-time execution block 310 receives the same test sequences from the test case generator 320 and parses those test sequences to produce the same sets of instructions 312 and 314 as were produced in the unit level test configuration 300 of FIG. 3.

The instructions 314 and 312 are received by the sequencer irritators 430 and 440, respectively, and, when relevant to the device under test 450, the instructions are parsed to produce stimulus that is applied to an interface of the multi-unit device under test 450. The same general testing process is therefore utilized to exercise the logic in the multi-unit device under test 450 as was utilized to exercise the device under test 350.

Returning to FIG. 2, at step 210, the multi-unit logic, multi-unit irritators (sequence irritators in the example illustrated), and the run-time execution block routines are debugged at the multi-unit level. Thus, each of these portions of the system is tested and any faults or bugs detected can be corrected prior to the next step of integration.

Figure 5:
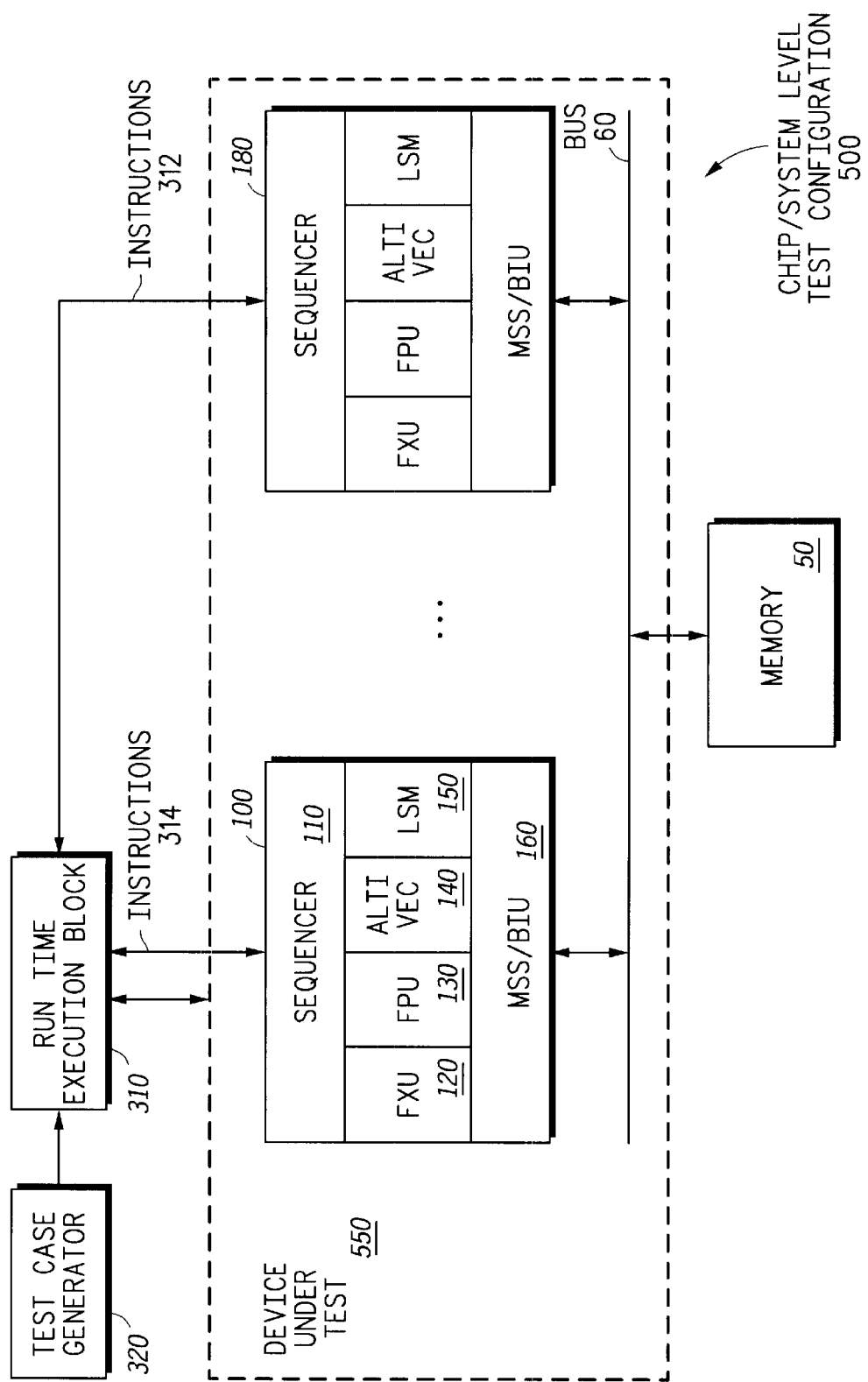
FIG. 5 illustrates a block diagram of a chip/system-level test configuration of a multiprocessing system as described with respect to the method of FIG. 2.

FIG. 5 illustrates the next integration step in which the entire multiprocessing system is simulated. The chip/system level test configuration 500 is shown to include both of the processors 100 and 180 along with the bus 60 in the device under test 550. Thus the entire processing unit is being operated in response to the run time executor. Because the sequencer included in each of the processors 100 and 180 is capable of processing instructions directly, the instructions 312 and 314 need not be provided to any type of irritator for conversion to transactional test signals. Once again, it is emphasized that the test case generator 320 and the run-time execution block 310 behave in the same general manner in the chip/system level test configuration 500 as they behaved in the multi-unit level test configuration 400 and the unit level test configuration 300. Therefore, the same test sequences and run-time execution parameters and routines developed and exercised in unit and multi-unit testing can be reused at the chip/system level. This reuse of the test sequences and run-time execution parameters and settings reduces the test development time and ensures that portions of the system exercised at the unit or multi-unit level are exercised at the chip/system level as well. This chip/system level testing is illustrated in FIG. 2 at step 212. At step 214, the chip/system logic is debugged along with the RTX parameters and routines that allow the test sequences to adequately exercise the entire multiprocessing system.

It should be noted that the test sequences generated at step 202 may be test sequences specifically targeted to the unit-level testing being performed at step 204. Such tests, although directed at the unit level, are instruction-based and therefore can be used to exercise the entire multiprocessing system at step 212. Alternately, the test sequences developed at step 202 may be generated specifically to exercise the entire multiprocessing system and not necessarily targeted at the specific unit being tested at step 204. However, due to the fact that the unit irritators included in the testing system exercising the unit at step 204 can process these instructions and generate transaction based stimulus for exercising the unit, such tests are still appropriate for unit simulation at step 204. Therefore, tests that are either generated for specific units, multi-unit groups, or the entire system can be employed for testing at various levels without any modification to the test sequences being required.

It should be apparent from the illustrations in FIGS. 3–5 that the logic tested in the unit level configuration of FIG. 3 is significantly less than that being tested in the chip/system level test configuration 500 of FIG. 5. The small amount of logic exercised in FIG. 3 allows for the logic within the unit being tested to be exercised with additional intensity such that the logic within that unit is fully exercised in a reduced amount of testing time. In addition to this, the unit irritators utilized to convert the instruction-based test sequences to transactional-based sequences filter out any instructions that do not affect the unit being tested. As such, the testing of the specific unit desired is performed much more efficiently.

Figure 6:
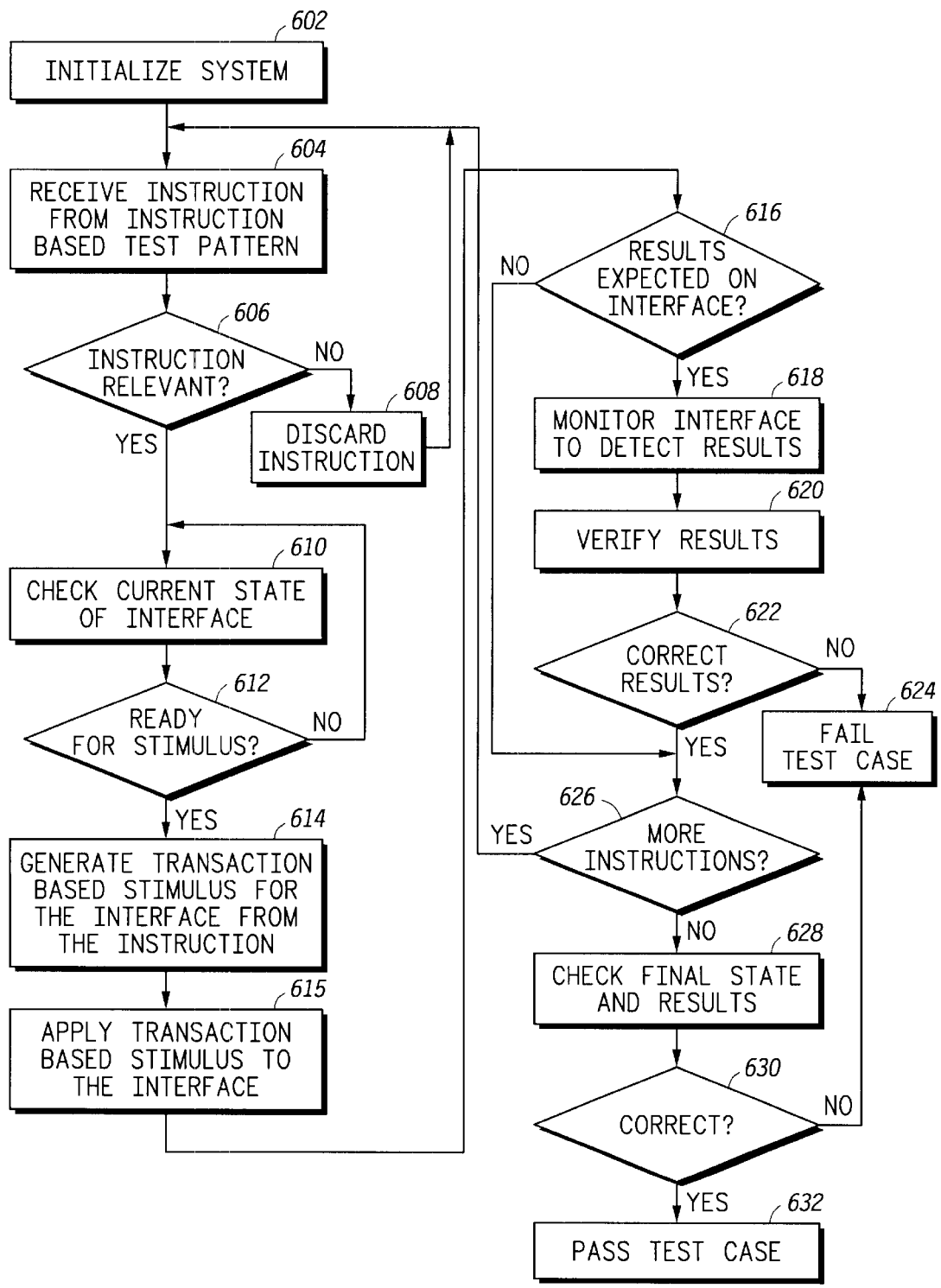
FIG. 6 illustrates a flow diagram of a method for performing unit-level multiprocessing verification in accordance with a particular embodiment of the present invention.

FIG. 6 illustrates a flow diagram of a method for verifying design logic of a particular unit based on instruction test sequences. The method begins at step 602 where the overall system is initialized. Step 602 is preferably performed based on run-time execution parameters, which configure the unit to be tested and the surrounding environment to allow various portions of the design logic within the unit to be fully exercised. For example, if a unit is capable of operating in numerous modes, one or more of these modes may be selected via the initialization at step 602. The initialization performed at step 602 may also initialize other portions of the test environment within which the unit is being exercised. For example, specific registers or locations in memory may be configured to include specific values that aid in testing the unit under test. Initialization may be based on a file that stores test initialization conditions and an execution means, which may be a run-time executor as described above.

At step 604, an instruction is received from an instruction-based test pattern. Preferably, the designed logic of the processing unit being tested includes a plurality of designed units comprising a core and a particular designed unit that has an interface with the core. The particular designed unit is the unit being tested via the method illustrated in FIG. 6. Because a number of the instructions included in the instruction-based test pattern may apply to other designed units included in the processing unit, only a portion of the instructions in the instruction-based test pattern may be relevant to the particular designed unit be tested. Once this set of instructions that will actually influence the operation of the unit being tested is determined, the instructions received from the instruction-based test pattern can be filtered to eliminate any irrelevant instructions.

At step 606, it is determined if the instruction received at step 604 is relevant to the particular designed unit being tested. If the instruction is not relevant, it is discarded at step 608. Note that although the instruction may be irrelevant to the testing of the particular designed unit, it is likely relevant to testing to the overall processing unit, and therefore will most likely not be discarded during testing at higher levels of integration that include additional portions of the processing unit.

Once it is determined that the instruction is relevant at step 606, the method proceeds to step 610 where the current state of the interface to the particular design unit is examined. The interface may be busy performing tasks associated with other portions of the test sequence and therefore not ready to receive any stimulus resulting from the received instruction. At step 612, it is determined whether or not the interface is ready to receive stimuli corresponding to the instruction received. If the interface is not ready, the method proceeds back to step 610 where the current state of the interface is monitored. If the interface is determined at step 612 to be ready to receive stimulus corresponding to the instruction, the method proceeds to step 614.

At step 614, transaction-based stimulus for the interface is generated based on the instruction received. The instruction is parsed to determine the specific signals on the interface that must be asserted, and how those signals should be asserted to properly stimulate the unit being tested. The transaction-based stimulus generated at step 614 may be generated based on information included in the reference model corresponding to the received instruction. For example, if the instruction caused the data located at address A in memory to be loaded into register G1, the reference model may indicate that the address A should be present on the address line interface to the unit when the proper stimulus is applied at the unit level. This can greatly simplify the generation of the transaction-based stimulus at step 614.

At step 615, the transaction-based stimulus is applied to the interface. In some instances, the transaction-based stimulus applied to the interface at step 615 will result in some type of response that will appear on the interface. At step 616, it is determined whether or not any results are expected on the interface. For example, a load instruction such as the example given immediately above would result in the data lines on the interface being configured to a particular data value matching the contents of the address to which the load instruction corresponded. If no results are expected at step 616, the method proceeds to step 626 where it is determined whether or not additional instructions are to be received. Assuming that additional instructions are to be received, the method returns to step 604.

If it is determined at step 616 that results are expected on the interface due to the transaction-based stimulus applied at step 615, the interface will be monitored at step 618 to detect the results. When the results are detected, the method proceeds to step 620 where the results are verified by comparing the results on the interface with the expected results. The expected results are preferably determined based on the system level reference model. For example, the example instruction provided earlier where a specific register G1 is to be loaded with the value stored in address A would result in the value stored in address A being returned on the data lines of the interface. This information may be included in the reference model, which allows for simplified expected response determination.

At step 622, it is determined whether the verification step 620 resulted in a determination that the correct results were returned on the interface. If incorrect results have been returned, the method proceeds to step 624 where the test case is failed. If correct results have been returned, the method proceeds to step 626 where it is determined whether or not additional instructions are to be received. Once again, if additional instructions are to be received, the method returns to step 604. If it is determined at step 626 that no more instructions are to be received, the method proceeds to step 628 where the final state and results are checked. The final state and results checking may included determining whether the final state of the testing environment is correctly configured, and may also include checking specific registers or other portions of the designed logic in the unit being tested to determine if the correct information is present.

At step 630, it is determined whether the final state and results match the expected final state and result, which are preferably determined based on the reference model for the entire system/chip. If the final state and results are not correct, the method proceeds to step 624 where the test case is failed. If the correct final state and results are determined at step 630, the method proceeds to step 632 where the test case is passed.

As can be seen by the flow diagram of FIG. 6, those instructions that are irrelevant to testing the specific designed unit of the processing unit that is being tested are discarded. Depending on the configuration of the instructions included in the test case, this may cause a large number of instructions to be discarded, whereas in prior art systems which were only capable of instruction-based testing at the system/chip level, these instructions would not be discarded and instead would require processing resources to execute. This reduces the processing bandwidth available for testing the specific unit being exercised. As such, the method illustrated in FIG. 6 is able to exercise the unit being tested in a much more efficient and timely manner. In addition to this, the instruction-based test pattern provided for exercising the unit is the same instruction-based test pattern that may be utilized to exercise either multi-unit blocks or the entire system level design.

Figure 7:
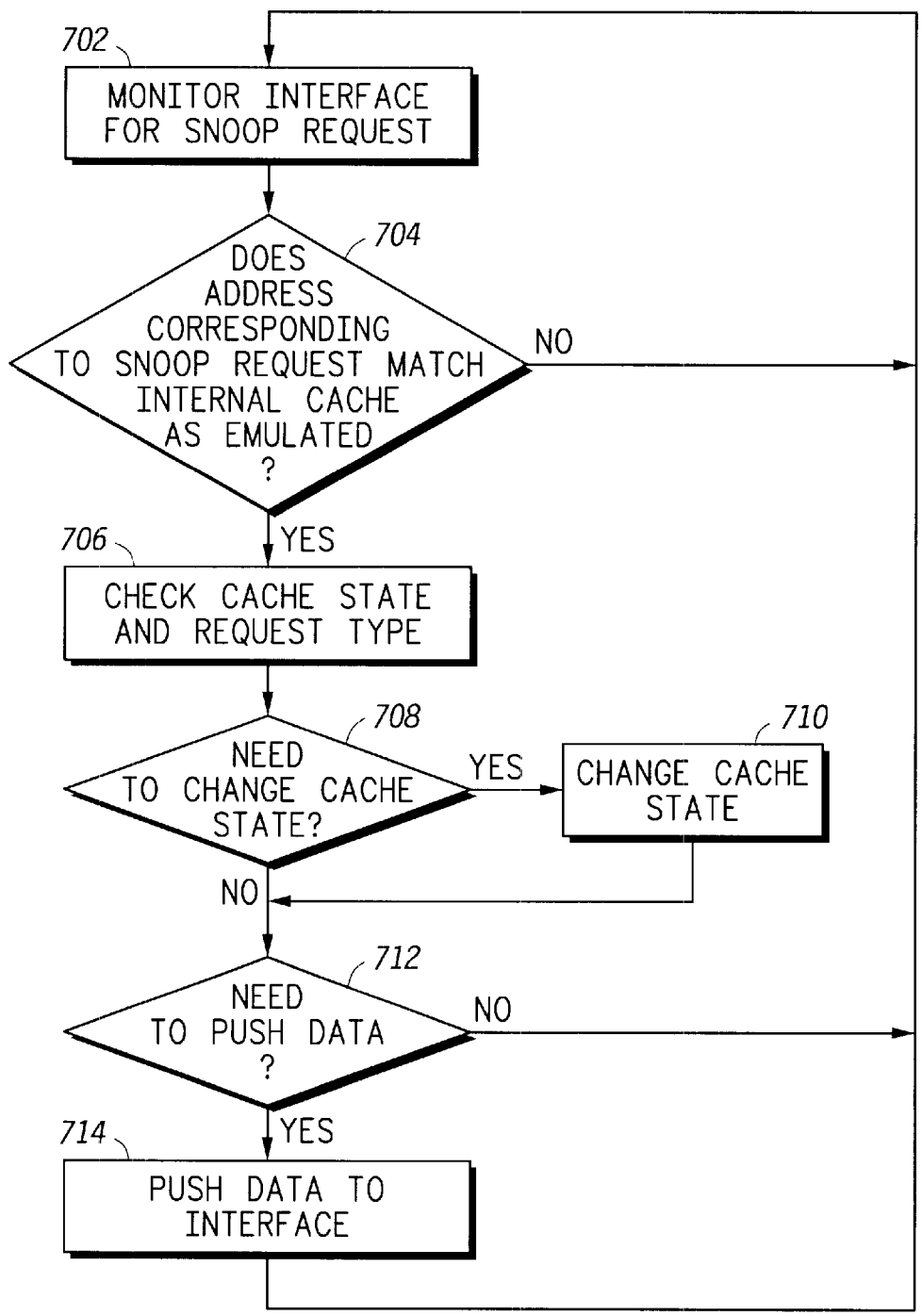
FIG. 7 illustrates a flow diagram of a method for responding to a snoop request in a unit-level multiprocessing environment in accordance with a particular embodiment of the present invention.

Because the irritator blocks exercising a particular unit may have to respond to stimulus resulting from instructions executed by other processing units within the multiprocessing system as well as those instructions intended to exercise the processing unit within which the irritator is being used, the method of FIG. 7 is preferably executed in parallel with that of FIG. 6. The method of FIG. 7 enables the irritator to monitor stimulus presented on the unit interface to determine when the irritator must respond in a manner that would mimic the other portions of the processing unit that it has effectively replaced with respect to the unit level simulation.

For example, if another processing unit in the multiprocessing system performs a memory operation that requires the processing unit which the irritator is effectively replacing to respond in some manner, the irritator must generate the appropriate response and apply that response to the unit interface. Thus, if the irritator is an LSM irritator as illustrated in FIG. 3, the LSM irritator may include support for a level one cache. As such, the level one cache may include the value corresponding to a particular address, which another processor in the multiprocessing environment wishes to access. As such, the LSM irritator must mimic the operation of a standard LSM unit with respect to providing the appropriate signals to the MSS/BIU block such that the other processing unit in the multiprocessing system is notified of the presence of a value corresponding to the particular address as it is currently stored in the level 1 cache. The method illustrated in FIG. 7 permits such notification to occur.

The method of FIG. 7 begins at step 702 where the unit interface is monitored for a snoop request. The snoop request will be issued when a bus operation is occurring in the multiprocessing system that requires the irritator to determine if it must provide some type of response based on the memory operation occurring.

When a snoop request is received at step 702, the method proceeds to step 704 where the address corresponding to the snoop request is examined to determine if it matches an internal cache as emulated by the irritator executing the method. Thus, in the example given above, if the LSM irritator determines that an address corresponding to a memory operation currently on the bus corresponds to an address that it currently has cached in its level one cache (as emulated), some type of response may be required. If it is determined at step 704 that the address does not match any addresses in the internal cache, the method returns to the monitoring step 702.

If it is determined at step 704 that the address does correspond to an address stored in an internal cache as emulated, the method determines if a response to the snoop request should be provided and such a response can then be provided according to the snoop type. At step 706, the current cache state with respect to the particular address is examined, and the memory operation, or request, is examined to determine what type (snoop type) of a memory operation resulted in the snoop request being flagged.

At step 708, it is determined whether or not the current cache state for the particular address as stored in the internal cache should be changed. For example, if the address corresponds to a cache location that had previously been in the exclusive unmodified state and another processing unit in the multiprocessing system initiated a load operation corresponding to the address, the state of the cache location corresponding to the address in the internal cache of the LSM irritator would have to be modified to reflect that the state is now shared. When required, the change of the cache state occurs at step 710.

At step 712, it is determined whether or not any data needs to be pushed onto the interface (stimulus applied) as the result of the memory operation causing the snoop request. For example, if another processing unit in the multiprocessing system was attempting to load the value stored at address A, and address A was included in the internal cache of the irritator in an exclusive modified state, the value stored in the cache would have to be provided to the bus 60 to ensure that the other processing unit retrieves the correct data corresponding to the address A. If no such data pushing is required, the method returns to the monitoring step 702. If data pushing is required, the method proceeds to step 714 where the data is pushed onto the interface. Pushing the data onto the interface is accomplished by applying the proper stimulus to the various signals present on the interface.

Thus, through the execution of the methods illustrates in FIGS. 6 and 7, an irritator or multi-unit irritator can properly filter received instructions and respond to snoop requests in order to enable the device under test to operate as it would in a fully integrated system level model. This enables instruction-based test sequences to be used to exercise the unit or multi-unit blocks being tested. Once the unit level blocks have been verified, subsequent integration steps produce multi-unit blocks, which can also be tested using the same configuration parameters and instruction sequences.

Once verification and debugging of the multi-unit levels occurs, the final integration step can occur to produce the system level design. Once fully integrated, the system level design can be tested using the same test sequences and once verification of the entire design is completed, the processing unit can be manufactured. Manufacturing of processing unit once fully designed is well known in the art.

In the foregoing specification, the invention has been described with reference to specific embodiments. However, one of ordinary skill in the art appreciates that various modifications and changes can be made without departing from the scope of the present invention as set forth in the claims below. Accordingly, the specification and Figures are to be regarded in an illustrative rather than restrictive sense, and all such modifications are intended to be included within the scope of the present invention.

We claim:

1. A method of verifying design logic of a processing unit which has a plurality of designed units including a designed memory subsystem having an interface, comprising the steps of:

defining a set of instructions for testing the processing unit;

defining a subset of the set of instructions relevant to the memory subsystem;

testing the designed memory subsystem responsive to the subset of instructions;

detecting a snoop request at the interface;

receiving an address and snoop type corresponding to the snoop request;

determining if the address is a match with respect to a cache structure; and providing a response according to the snoop type.

2. The method of claim 1, wherein the testing of the designed memory subsystem further comprises:

operating the designed memory subsystem in response to a run time executor.

3. The method of claim 2 further comprising:

operating a block that includes the designed memory subsystem and at least one additional designed unit of the plurality of designed units.

4. The method of claim 2 further comprising:

operating the processing unit in response to the run time executor.

5. The method of claim 4, wherein the testing of the designed memory subsystem further comprises:

translating the subset of instructions into a plurality of transactions.

6. The method of claim 1, further comprising:

storing test initialization conditions;

using the test initialization conditions in testing the designed memory subsystem; and using the test initialization conditions in testing the processing unit.

7. A method of verifying design logic of a processing unit which has a plurality of designed units including a designed memory subsystem having an interface, comprising:

defining a set of instructions for testing the processing unit;

defining a subset of the set of instructions relevant to the memory subsystem;

testing the deigned memory subsystem responsive to the subset of instructions, comprising translating the subset of instructions into a plurality of transactions;

detecting a snoop request at the interface;

receiving an address and snoop type corresponding to the snoop request;

determining if the address is a match with respect to a cache structure; and providing a response according to the snoop type.

8. A system of verifying design logic of a processing unit which has a plurality of designed units including a designed memory subsystem, comprising:

an irritator that converts instructions relevant to the designed memory subsystem into transactions;

a test case generator for verifying the design logic of the processing unit, wherein the test case generator generates instructions for exercising the processing unit; a run time executor operably coupled to the irritator and the test case generator, wherein the run time executor operates the designed memory subsystem using the irritator based at least in part on the instructions generated by the test case generator, wherein the run time executor can operate the designed memory subsystem both independently and in conjunction with additional designed units of the processing unit;

a file which stores initial conditions; and execution means, coupled to the file, which sets the initial conditions stored in the file for the designed memory subsystem when the designed memory subsystem is being verified independently and when the designed memory subsystem is being verified as included in the processing unit.

9. In a system of verifying design logic of a processing unit which has a plurality of designed units comprising a core and a particular designed unit which has an interface with the core, a method for performing a unit test of the particular designed, unit, comprising the steps of:

defining a set of instructions for testing the processing unit;

receiving an instruction from the set of instructions;

determining if the instruction is relevant to the particular designed unit;

checking a state of the interface;

deriving a stimulus from the instruction;

providing the stimulus to the particular designed unit via the interface;

determining an expected response from the particular designed unit;

receiving response from the particular designed unit; and comparing the response received with the expected response.

10. The method of claim 9, further comprising the steps of:

detecting a snoop request at the interface;

receiving an address and snoop type;

determining if the address is a match with respect to a cache; and providing a response according to the snoop type.

11. The method of claim 9, wherein the particular designed unit is a memory subsystem.

* * * * *

UNITED STATES PATENT AND TRADEMARK OFFICE
CERTIFICATE OF CORRECTION

PATENT NO. : 6,567,934 B1
DATED : May 20, 2003
INVENTOR(S) : Jen-Tien Yen et al.

It is certified that error appears in the above-identified patent and that said Letters Patent is hereby corrected as shown below:

Column 13,
Line 65, change "deigned" to -- designed --.

Column 14,
Line 38, delete "," after "designed".

Signed and Sealed this

Fourth Day of November, 2003

JAMES E. ROGAN
*Director of the United States Patent and Trademark Office*